(12) United States Patent
Ko et al.

(10) Patent No.: US 6,992,509 B2
(45) Date of Patent: Jan. 31, 2006

(54) SWITCHED-CAPACITOR SAMPLE/HOLD HAVING REDUCED AMPLIFIER SLEW-RATE AND SETTLING TIME REQUIREMENTS

(75) Inventors: Terasuth Ko, Hong Kong (HK); Chi Chun Wong, Hong Kong (HK)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 10/677,449

(22) Filed: Oct. 2, 2003

(65) Prior Publication Data

US 2005/0073351 A1   Apr. 7, 2005

(51) Int. Cl.
G11C 27/02   (2006.01)
(52) U.S. Cl. .................. 327/96; 327/337; 341/122
(58) Field of Classification Search ............ 327/94–96, 327/336–337, 554; 341/122–125
See application file for complete search history.

(56) References Cited

U.S. PATENT DOCUMENTS

| | | | | |
|---|---|---|---|---|
| 4,574,250 A | * | 3/1986 | Senderowicz ............... | 330/258 |
| 5,144,160 A | * | 9/1992 | Lee et al. ...................... | 327/96 |
| 6,137,321 A | * | 10/2000 | Bazarjani ..................... | 327/96 |
| 6,169,427 B1 | * | 1/2001 | Brandt ......................... | 327/94 |
| 6,529,237 B1 | * | 3/2003 | Tsay et al. .................. | 348/241 |
| 6,636,084 B2 | * | 10/2003 | Sarraj .......................... | 327/95 |

* cited by examiner

Primary Examiner—Minh Nguyen
(74) Attorney, Agent, or Firm—Jeffrey D. Moy; Harry M. Weiss; Weiss, Moy & Harris, P.C.

(57) ABSTRACT

A switched-capacitor sample/hold circuit and method having reduced slew-rate and settling time requirements provides for lower-cost and/or lower-power implementation of sample/hold circuits and/or reduced error due to amplifier characteristics. The switched-capacitor sample/hold circuit incorporates a pair of capacitors that are alternatively and mutually-exclusively switched between an input sample position and an amplifier hold position, providing a dual sampled amplifier output signal that has reduced transitions at each sample interval. An alternative embodiment of the sample/hold circuit incorporates a fully-differential amplifier having a differential input and a differential output. Four capacitors are employed forming two of the dual sampled switched-capacitor circuits, one in each negative feedback path (inverted output to non-inverting input, non-inverted output to inverting input) of the amplifier. The two dual sampled switched-capacitor circuits are referenced to each other, providing fully differential operation and cancellation of error due to charge injection.

15 Claims, 5 Drawing Sheets

SWITCHED-CAPACITOR SAMPLE/HOLD HAVING REDUCED AMPLIFIER SLEW-RATE AND SETTLING TIME REQUIREMENTS

BACKGROUND OF THE INVENTION

1. Field of the Invention

The present invention relates generally to analog signal sampling circuits, and more specifically, to a switched-capacitor sample/hold having reduced amplifier slew-rate and settling time requirements.

2. Background of the Invention

Switched-capacitor sample/hold circuits are in common use today. Integrated circuits such as analog-to-digital (A/D) converters as well as voltage-to-frequency (V/F) converters, switched capacitor filters and other analog signal processing components often incorporate switched-capacitor circuits and in particular switched-capacitor sample/hold circuits to provide sampling and filtering circuits with controllable gain and circuit performance.

The simplest form of sample/hold circuit utilizes a single capacitor and a switch that samples the input signal onto the capacitor for a fixed interval. The capacitor is followed by a buffer amplifier that isolates subsequent stages. Improved switched-capacitor sample/hold circuits alternate the position of a single capacitor between an input signal terminal and a feedback position in the follower amplifier, providing a sampled state that is isolated from the input and has low droop in the hold phase. However, the simple alternating position sample/hold circuit requires that the amplifier transition from a zero state to a full value corresponding to the sampled signal at each sampling interval.

Improved versions of the simple alternating position sample/hold circuit have been developed that use a secondary holding capacitor to hold the previous output value at the amplifier during the sample state, but for high level input signals at input frequencies approaching half of the sampling rate (i.e., the Nyquist rate), the amplifier still must transition significantly from the sample state to the hold state, as the previous value has changed significantly from the last sample. The requirement on the amplifier to respond to steps in output voltage in all of the above-described circuits sets a minimum slew rate and settling time requirement for a particular accuracy in the sample/hold circuit. The slew rate and setting time of the amplifier are a source of error in the switched-capacitor sample/hold circuit. The slew rate and settling time are cost drivers for the amplifier, and within an integrated circuit can mean increased area and power dissipation and/or increased voltage requirements.

Another source of error in switched-capacitor circuits in general, and switched-capacitor sample/hold circuits in particular, is error due to charge injection. Charge injection occurs when the control input of a switch that couples an analog signal to the sampling or holding capacitor transitions and charge is transferred via capacitive coupling from the control input of the switch (typically the gate of a MOSFET) to the capacitor.

Non-linearity error is particularly pervasive in the input switches of sample/hold circuits, as the switch control signals are typically logic signals and as the sampled input voltage increases, the difference between the gate-to-source voltage of the switch transistors over the threshold voltage effectively decreases in a manner that is dependent on the input signal and thereby introduces non-linearities.

Therefore, it would be desirable to provide a sample/hold circuit having reduced amplifier settling time and slew-rate requirements and reduced error resulting from amplifier settling time and slew-rate. It would further be desirable to provide such sample/hold circuit that has reduced susceptibility to error due to charge injection and improved linearity.

SUMMARY OF THE INVENTION

The above objective of providing a switched-capacitor sample/hold circuit having a reduced amplifier slew rate and settling time requirement and reduced error due to amplifier slew rate and settling time is provided in a new switched-capacitor sample/hold circuit and method of operation of a sample/hold circuit. The above objectives of reducing error due to charge injection and improving linearity is provided in a differential embodiment of the circuit and method of the present invention.

The new switched-capacitor sample/hold circuit includes two capacitors, both of which are alternatively and mutually-exclusively placed in an input sampling position and an amplifier feedback hold position, providing a double sampling of the input signal that reduces the magnitude of transitions on the output of the sample/hold amplifier.

The differential embodiment of the new sample/hold circuit uses four capacitors and a fully differential buffer amplifier that includes a differential input and a differential output. The above-described double-sampled switched-capacitor circuit is effectively duplicated for each negative feedback output-input pair of the differential amplifier (e.g., one circuit is connected to the inverting input and the non-inverted output and the other circuit is connected to the non-inverting input and the inverted output). The two double-sampled switched-capacitor circuits are referenced to each other rather than a ground node, providing fully differential operation that cancels error due to charge injection to the degree of symmetry of the charge-injection magnitude (e.g., the matching of the input switching transistor gate-drain capacitances $C_{gd}$).

The foregoing and other objectives, features, and advantages of the invention will be apparent from the following, more particular, description of the preferred embodiment of the invention, as illustrated in the accompanying drawings.

DETAILED DESCRIPTION OF THE PREFERRED EMBODIMENTS

Figure 1:
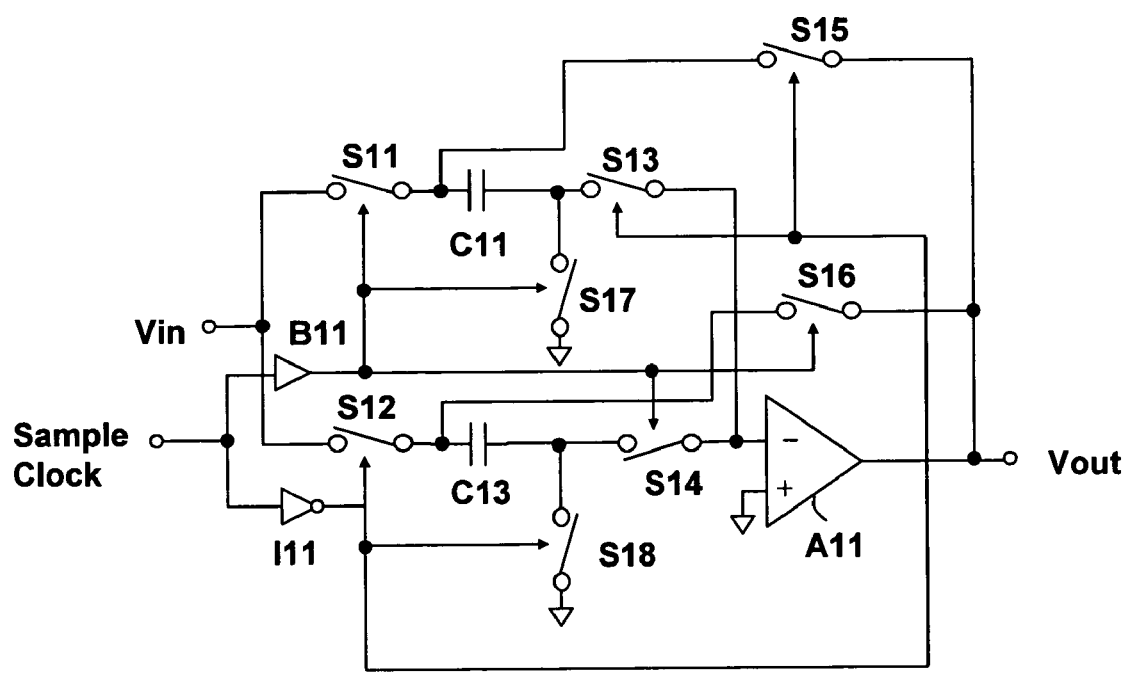
FIG. 1 is a schematic diagram depicting a sample/hold circuit in accordance with an embodiment of the present invention.

Referring now to the figures, and in particular to FIG. 1, a sample/hold circuit in accordance with an embodiment of the invention is depicted. An input voltage Vin is alternatively applied to a first capacitor C11 or a second capacitor C13 via switches S11 and S12 to sample an input signal. When capacitor C11 is selected for sampling, switch S17 is closed, grounding a second terminal of capacitor C11, similarly switch S18 grounds a second terminal of capacitor C13, when capacitor C13 is selected for sampling. The capacitor (C11 or C13) that is not selected for sampling is connected via switches S13 and S15 (for C11) or switches S14 and S16 (for C13) in the feedback path of an amplifier A11, which provides a sampled output Vout. The control signals for switches S11-S18 are provided by buffer B11 and inverter I11 so that two complementary phases of the sampling clock signal are provided for selecting the alternate states required for switches S11–S18. The circuit of FIG. 1 is a simplified circuit provided for illustration, and actual implementations will generally use more complex switching clock phase arrangements so that overlapping switch states are not generated, as will be described below in more detailed embodiments of the present invention.

Figure 2:
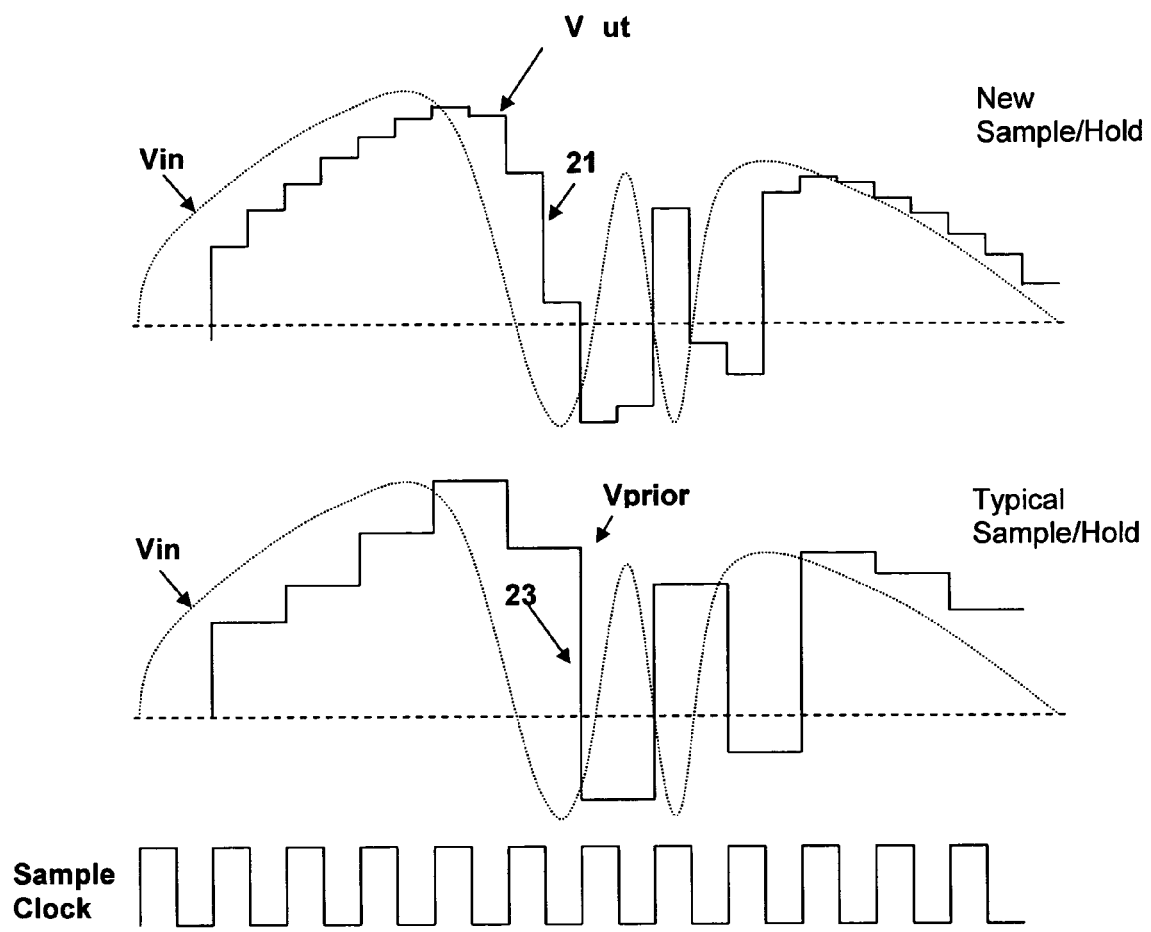
FIG. 2 is a pictorial diagram depicting signals within a sample/hold circuit in accordance with an embodiment of the present invention shown in contrast with signals for a typical sample/hold circuit.

With further reference to FIG. 2, operational advantages of the sample/hold circuit of the present invention are illustrated. As can be seen from the diagram at the top of the figure, amplifier A11 output Vout has a step characteristic that follows the shape of input signal Vin. Note that the Vout signal is delayed by one-half of the sample clock period, as the sampled value is not transferred to the amplifier A11 output until the alternate state of the sample clock. In contrast, a sampled waveform of output signal Vprior of a typical sample/hold circuit is depicted in the lower sampling diagram. Note that the sampled waveform is also delayed by one-half of the sampling interval, but contains half as many steps, as the input sampled value is only transferred to the amplifier once per sample clock period. The result is that transitions of the sampled waveform such as transition 23 are larger than the transitions of the Vout signal of the present invention (such as transition 21) for signals approaching the Nyquist frequency (i.e., ½ of the sample clock frequency) as depicted in the portion of the input waveform in the center of the diagram near transitions 21 and 23. In general, the largest transitions in a sample/hold circuit output, and thus the greatest demands on the amplifier are produced for signals closest to the Nyquist frequency, as lower-frequency input signals change more slowly and thus the variation in the output signal is spread over more samples.

Therefore, the sample/hold circuit of the present invention has relaxed slew rate and settling time requirements for amplifier 11 for a given allowable sampling error, and/or a lower sampling error for a given amplifier performance. Therefore, the circuit of FIG. 1 can provide improved performance for a particular design, or provide a lower-power or circuit size design for a predetermined sample/hold performance level. Also, it should be noted that while the doubled number of steps shown in signal Vout is due to a double-sampled operation within the sample/hold circuit of the present invention, only half of the steps are actually used in further conversion or other operations. The output signal taken during either phase of sample clock, but not both. In effect, the internal update rate of the amplifier is doubled, reducing the size of transitions the amplifier output must make, while the actual sample rate of the sample/hold remains the same.

Figure 3:
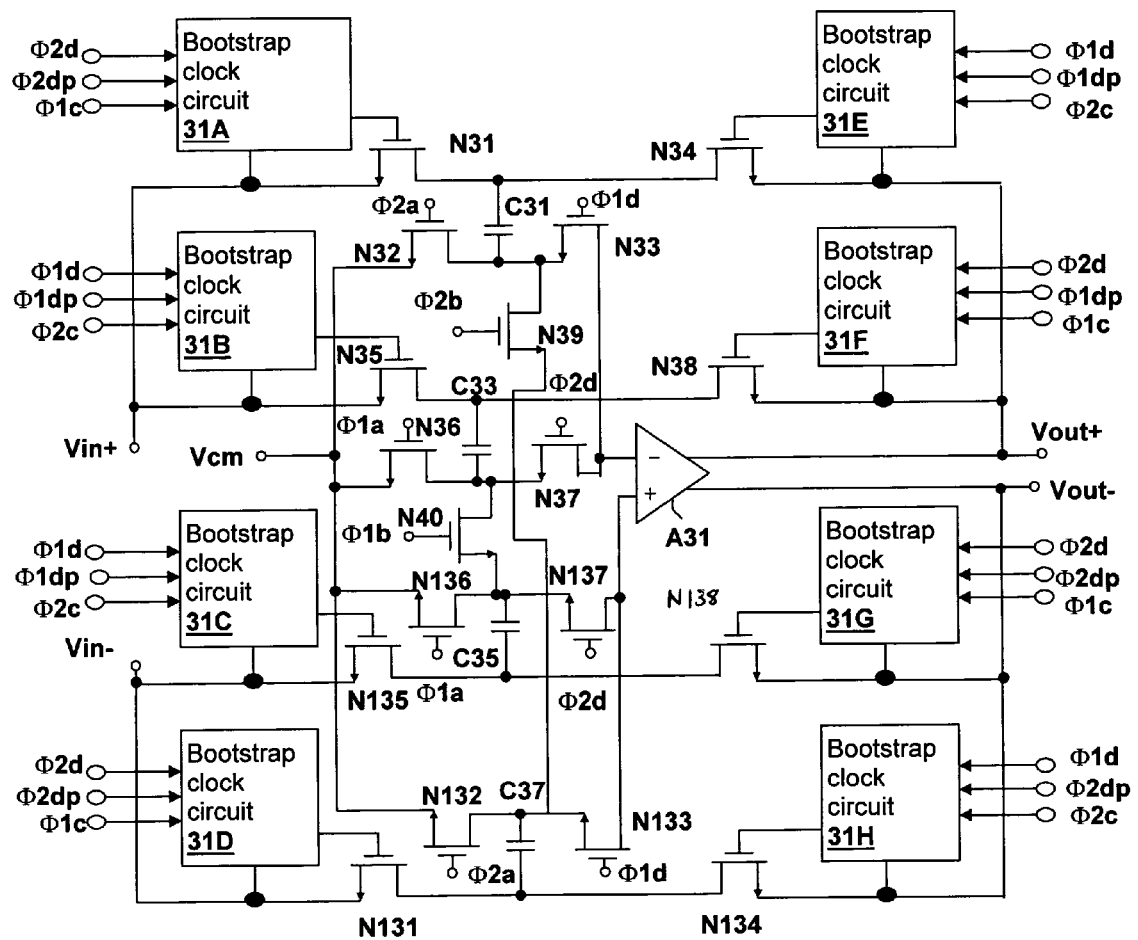
FIG. 3 is a schematic diagram depicting a sample/hold circuit in accordance with another embodiment of the present invention.

Referring now to FIG. 3, a sample/hold circuit in accordance with an embodiment of the present invention is depicted. The circuit of FIG. 3, includes several improvements and implementation details not shown in the circuit of FIG. 1. Bootstrap clock circuits 31A are provided with multiple non-overlapping phases generated by a clock phase generator circuit and control the gates of the switch transistors with a source-terminal dependent level to improve linearity of the sample/hold circuit. Also, the sample/hold circuit of FIG. 3 is a fully differential circuit, which further reduces charge injection error and other errors in the sample/hold circuit, as the differential design provides protection from common-mode noise and cancels charge injection error, which is a common-mode error for the circuit configuration shown. (The switch transistors are of the same type and switched by the same clock phase/voltage levels, so the charge transfer has the same polarity and a magnitude that differs only due to differences between the $C_{gs}$ of the switch transistors).

Switch transistors N31 and N32 control placement of capacitor C31 in the input sample position, while switch transistors N33 and N34 control placement of capacitor C31 in a feedback path of amplifier A31 (in this case, the negative feedback path between the non-inverted output and the inverting input of amplifier A31). Similarly capacitor C33, which samples in alternation with capacitor C31 in a manner similar to the operation of the circuit of FIG. 1, is placed in the input sample position by activation of switch transistors N35 and N36, while transistors N38 and N37 control placement in the above-described feedback path of amplifier A31. Bootstrap clock circuits 31A–B provide control of input switch transistors N31 and N35, so that linearity is improved as described below, and bootstrap clock circuits 31E–F, provide control of switch transistors N34 and N38, also reducing non-linearity resulting from differences between steps in the output signal of amplifier A31.

At the bottom of FIG. 3, a circuit identical to that described above is coupled to the non-inverting input and the inverted output terminals of amplifier A31, providing the fully differential sample/hold circuit of the present embodiment. Switch transistors N131 and N132 control placement of capacitor C37 in the input sample position, while switch transistors N133 and N134 control placement of capacitor C37 in the other feedback path of amplifier A31 (the negative feedback path between the inverted output and the non-inverting input of amplifier A31). Similarly capacitor C35, which samples in alternation with capacitor C37, is placed in the input sample position by activation of switch transistors N135 and N136, while transistors N138 and N137 control placement in the above-described other feedback path of amplifier A31. Bootstrap clock circuits 31C–D provide control of input switch transistors N131 and N135, and bootstrap clock circuits 31G–H, provide control of switch transistors N134 and N138.

Rather than referring the input signal to ground as in the non-differential circuit of FIG. 1, in the embodiment of FIG. 3, a common-mode reference signal Vcm is supplied. Switch transistors N32, N36, N132 and N136 couple their respective capacitors as described above to this common-mode reference, rather than ground. Also, Switch transistors N39 and N40, are activated to further reduce any differences between the common-mode voltage as applied to the common-mode terminal of capacitors C31 and C37 (by transistor N39) and capacitors C33 and C35 (by transistor N40), when the associated capacitors are selected for sampling the input.

The circuit of FIG. 3 thus provides a highly accurate sample/hold circuit that has improved accuracy in particular for frequencies near the Nyquist frequency. The circuit is capable of sampling an input signal frequency at 100 Mhz at a 60 Ms/s sampling rage with a spurious-free dynamic range (SFDR) greater than 80 dB. At low input signal frequencies, SFDR performance rises to greater than 90 dB.

Figure 4A:
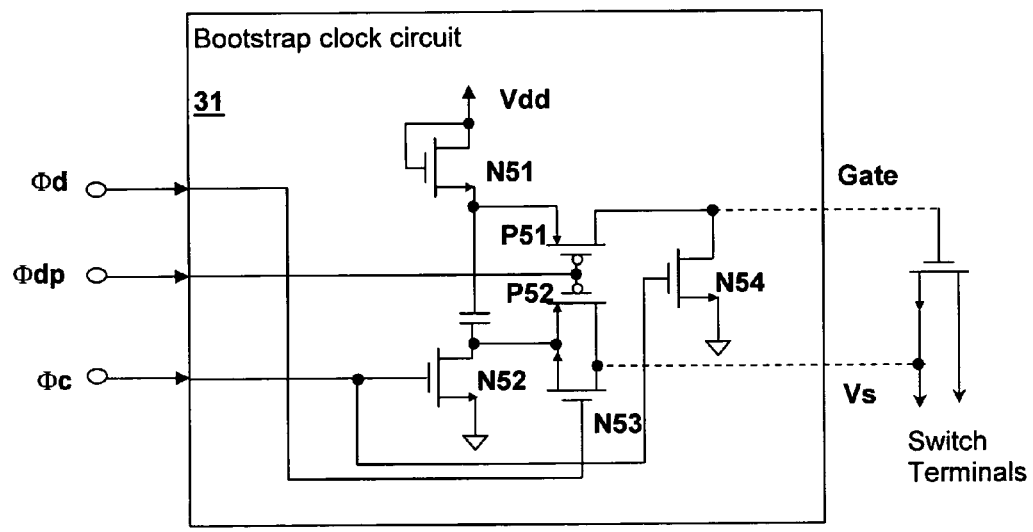
FIG. 4A is a schematic diagram depicting a bootstrap clock circuit as may be used to implement bootstrap clock circuits 31A–H of FIG. 3.
Figure 4B:
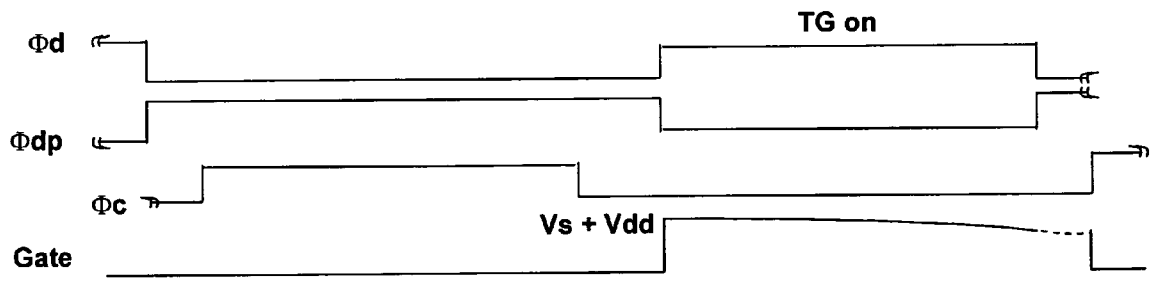
FIG. 4B is a signal diagram showing the relationship of signals within the bootstrap clock circuit of FIG. 4A.

Referring now to FIG. 4A, a bootstrap clock circuit 31 as may be used to implement bootstrap clock circuits 31A–H of FIG. 3 is depicted. Referring also to FIG. 4B, signals within the circuit of FIG. 4A are depicted for illustration of operation. $\Phi d$ is the d-phase input as indicated for each bootstrap circuit 31A–H and $\Phi dp$ is a complement (inverse) of the $\Phi d$ clock signal. $\Phi c$ is the c-phase clock input, also as indicated for each bootstrap circuit. The c-phase clock signal is the clock signal for the opposing sampling phase, used because it is valid for a window within the period while the d-phase clock signal is deasserted. Note that the $\Phi 1d$ signal is used with the $\Phi 2c$ signal and the $\Phi 1c$ signal is used with the $\Phi 2d$ signal in the circuit of FIG. 3.

The gate of an external transistor (e.g., transistor N31 as shown) is controlled by bootstrap clock circuit 31 in conformity with the above-mentioned clock inputs and with a sensed source voltage of the external transistor. Prior to assertion of the c-phase clock signal, capacitor C41 is charged to Vdd through transistor N51 and transistor N52 when the d-phase clock signal is deasserted. Transistor N52 which couples the terminal of capacitor C41 opposite transistor N52 to ground until the c-phase clock signal is asserted, at which time capacitor C41 is fully charged to Vdd. A transmission gate formed by transistors N53 and P52 is enabled by the d-phase clock and couples the source of the external transistor to a first terminal of capacitor C41, raising the second terminal of capacitor C41 to a signal-dependent level (Vdd+Vs). Simultaneously, the raised voltage level is applied to the gate of the external transistor through transistor P51 and when the d-phase clock is deasserted, transistors N53, P52 and P51 are turned off and the gate of the external transistor is left floating. At the end of the phase-c signal, a transistor N54 completely turns off the gate of the external transistor. The bootstrap circuit depicted applies a voltage-dependent gate control signal for switching that maintains switching transistor Vgs (on) at a constant level and thus improves linearity of the sample/hold circuit.

Figure 5A:
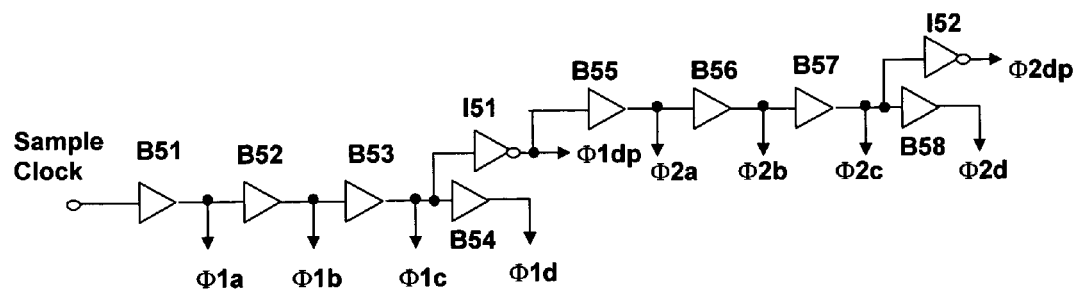
FIG. 5A is a schematic diagram depicting a clock driver circuit for use with the sample/hold circuit of FIG. 3.
Figure 5B:
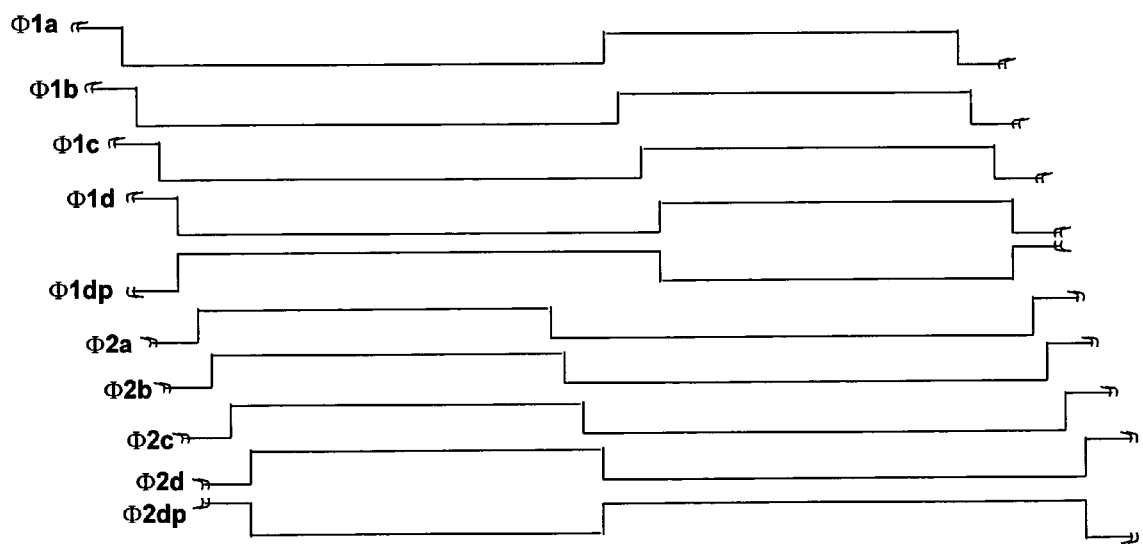
FIG. 5B is a timing diagram showing the relationship of clock phases of the clock driver circuit of FIG. 4A.

Referring now to FIG. 5A, a clock generator circuit is depicted for providing the clock signals used in the circuits of FIGS. 3 and 4. Referring further to FIG. 5B, the timing relationship of the above-mentioned clock signals is shown. Buffers B51–B54 forms a buffer chain that receives the sample clock input and generate four phases of a sampling clock for a first sampling phase, consecutively delayed by the delays of the buffer chain. Inverter I51 inverts the c-phase clock and delays it by the same delay as provided by buffer B54, providing a complementary d-phase signal. Buffers B55–B58 form a second buffer chain providing four clock phases for a second sampling phase and inverter I52 provides an inverted version of the second d-phase signal. The timing relationships of the clock generator signals are as depicted in FIG. 5B.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A sample/hold circuit, comprising:
   an amplifier having an output for providing an output of said sample/hold circuit;
   a first capacitor for sampling a value of an input signal during a first sampling phase of a sample clock;
   a second capacitor for sampling a value of said input signal during a second sampling phase of said sample clock; and
   a switching circuit for alternatively selecting one of said first capacitor and said second capacitor for coupling to said input signal during each phase of said sample clock, wherein another one of said first capacitor and said second capacitor not selected for coupling to said input signal is coupled between said output of said amplifier and an input of said amplifier for holding a value at an output of said amplifier sampled during a previous phase of said sample clock, whereby each of said first capacitor and said second capacitor alternates between sampling said input signal and holding said value in a mutually-exclusive manner, whereby transitions in said output of said amplifier are reduced between sampling intervals of said sample/hold;
   wherein said sample/hold circuit further comprises at least one input bootstrap clock circuit coupled to said switching circuit for generating a control signal having an on-state control voltage derived in conformity with a voltage level of said input signal, whereby the on-state of a control voltage input of at least one switch that couples said first capacitor to said input signal is maintained at a substantially constant level with respect to said input signal.

2. The sample/hold circuit of claim 1, wherein said input signal is a differential input signal pair, wherein said amplifier is a fully differential amplifier having a differential amplifier input pair and a differential output pair for providing a differential output of said sample/hold, wherein said first and second capacitor are alternatively and mutually-exclusively coupled to one of a first input of said differential input pair and a feedback position between a first output of said differential output pair and a first one of said differential amplifier input pair, and wherein said sample/hold circuit further comprises:
   a third capacitor for sampling a value of said input signal during said first phase of said sample clock; and
   a fourth capacitor for sampling a value of said input signal during said second phase of said sample clock, and wherein said switching circuit alternatively selects one of said third capacitor and said fourth capacitor for coupling to a second one of said differential input signal pair during each phase of said sample clock, wherein another one of said third capacitor and said fourth capacitor not selected for coupling to said second differential input signal is coupled between said second output of said differential output pair and said second one of said differential amplifier input pair for holding said value at an output of said amplified obtained in conformity with a previous phase of said sample clock, whereby each of said third capacitor and said fourth capacitor alternates between sampling said input signal and holding said value in a mutually-exclusive manner.

3. The sample/hold circuit of claim 2, wherein said switching circuit further comprises:
   a first shunt switch for shorting a first common-mode terminal of said first capacitor to a third common-mode terminal of said third capacitor; and a second shunt switch for shorting a second common-mode terminal of said second capacitor to a fourth common-mode terminal of said fourth capacitor, and wherein said switching circuit is coupled to control inputs of said first shunt switch and said second shunt switch for further reducing deviations between terminals of said first capacitor, said second capacitor, said third capacitor and said fourth capacitor while coupled to a common mode voltage of said sample/hold circuit.

4. The sample/hold circuit of claim 3, wherein said input bootstrap clock circuit comprises:
   a boost capacitor having a first terminal selectively coupled, to said control voltage input of said at least one switch;
   a charging circuit coupled to said first terminal of said boost capacitor for charging said boost capacitor to a predetermined constant voltage level; and
   a transmission gate for transferring said voltage level of said amplifier output signal to a second terminal of said boost capacitor prior to said coupling of said first terminal of said boost capacitor to said control voltage input of said at least one switch, whereby said first terminal of said boost capacitor is raised to a voltage level substantially equal to said predetermined constant voltage level plus said voltage level of said amplifier output signal.

5. The sample/hold circuit of claim 1, further comprises at least one output bootstrap clock circuit coupled to said switching circuit for generating a control signal having an on-state control voltage derived in conformity with a voltage level of said amplifier output signal, whereby the on-state of a control voltage input of at least one switch that couples said first capacitor to said amplifier output is maintained at a substantially constant level with respect to said amplifier output signal.

6. The sample/hold circuit of claim 1, wherein said input bootstrap clock circuit comprises:
   a boost capacitor having a first terminal selectively coupled to said control voltage input of said at least one switch;
   a charging circuit coupled to said first terminal of said boost capacitor for charging said boost capacitor to a predetermined constant voltage level; and
   a transmission gate for transferring said voltage level of said input signal to a second terminal of said boost capacitor prior to said coupling of said first terminal of said boost capacitor to said control voltage input of said at least one switch, whereby said first terminal of said boost capacitor is raised to a voltage level substantially equal to said predetermined constant voltage level plus said voltage level of said input signal.

7. A sample/hold circuit comprising:
   an amplifier having an output for providing an output of said sample/hold circuit;
   a first capacitor for sampling a value of an input signal during a first sampling phase of a sample clock;
   a second capacitor for sampling a value of said input signal during a second sampling phase of said sample clock; and
   a switching circuit for alternatively selecting one of said first capacitor and said second capacitor for coupling to said input signal during each phase of said sample clock, wherein another one of said first capacitor and said second capacitor not selected for coupling to said input signal is coupled between said output of said amplifier and an input of said amplifier for holding a value at an output of said amplifier sample during a previous phase of said sample clock, whereby each of said first capacitor and said second capacitor alternates between sampling said input signal and holding said value in a mutually-exclusive manner, whereby transitions in said output of said amplifier are reduced between sampling intervals of said sample/hold;
   wherein said sample/hold circuit further comprises at least one output bootstrap clock circuit coupled to said switching circuit for generating a control signal having an on-state control voltage derived in conformity with a voltage level of said amplifier output signal, whereby the on-state of a control voltage input of at least one switch that couples said first capacitor to said amplifier output is maintained at a substantially constant level with respect to said amplifier output signal.

8. A sample/hold circuit, comprising:
   an amplifier having a first output for providing a first output of said sample/hold circuit, an inverting input and a non-inverting input;
   a first capacitor;
   a first transistor having a first channel terminal connected to an input voltage of said sample/hold and a second channel terminal connected to a first terminal of said first capacitor;
   a second transistor having a first channel terminal connected to a reference voltage of said sample/hold and a second channel terminal connected to a second terminal of said first capacitor;
   a third transistor having a first channel terminal connected to said inverting input at said amplifier and a second channel terminal connected to said second terminal of said first capacitor;
   a fourth transistor having a first channel terminal connected to said first amplifier output and a second channel terminal connected to said first terminal of said first capacitor;
   a second capacitor;
   a fifth transistor having a first channel terminal connected to said input voltage of said sample/hold and a second channel terminal connected to a first terminal of said second capacitor;
   a sixth transistor having a first channel terminal connected to said reference voltage and a second channel terminal connected to a second terminal of said second capacitor;
   a seventh transistor having a first channel terminal connected to said inverting input of said amplifier and a second channel terminal connected to said second terminal of said second capacitor;
   an eighth transistor having a first channel terminal connected to said first amplifier output and a second channel terminal connected to said first terminal of said second capacitor;
   a switching control circuit coupled to gates of all of said transistors for alternating said first capacitor and said second capacitor in a mutually exclusive manner by enabling said first, second, seventh and eighth transistors in alternation with said third, fourth, fifth and sixth transistors;
   a boost capacitor;
   a boost transistor having a first channel terminal connected to a gate of said first transistor and a second channel terminal coupled to a first terminal of said boost capacitor;
   a transmission gate coupled to a second terminal of said boost capacitor and said input of said sample/hold circuit; and a charging circuit for charging said boost capacitor to a predetermined voltage level, and wherein said switching circuit selectively enables said transmission gate and said boost transistor when said first transistor is initially enabled, whereby a gate voltage of said first transistor is boosted in conformity with a value of said input signal.

9. The sample/hold circuit of claim 8, wherein said amplifier is a differential amplifier, wherein said first output of said amplifier is a non-inverted output and wherein said differential amplifier further has an inverted output, and wherein said sample/hold circuit further comprises:

a third capacitor;

a ninth transistor having a first channel terminal connected to an inverted input voltage of said sample/hold and a second channel terminal connected to a first terminal of said third capacitor;

a tenth transistor having, a first channel terminal connected to said reference voltage of said sample/hold and a second channel terminal connected to a second terminal of said third capacitor;

an eleventh transistor having a first channel terminal connected to said non-inverting input of said amplifier and a second channel terminal connected to said second terminal of said third capacitor;

a twelfth transistor having a first channel terminal connected to said inverted amplifier output and a second channel terminal connected to said first terminal of said third capacitor;

a fourth capacitor;

a thirteenth transistor having a first channel terminal connected to said inverted input voltage and a second channel terminal connected to a first terminal of said fourth capacitor;

a fourteenth transistor having a first channel terminal connected to said reference voltage and a second channel terminal connected to a second terminal of said fourth capacitor;

a fifteenth transistor having a first channel terminal connected to said non-inverting input of said amplifier and a second channel terminal connected to said second terminal of said fourth capacitor; and a sixteenth transistor having a first channel terminal connected to said inverted amplifier output and a second channel terminal connected to said first terminal of said fourth capacitor, and wherein said switching control circuit is further coupled to gates of said ninth, tenth, eleventh, twelfth, thirteenth, fourteenth, fifteenth and sixteenth transistors for alternating said third capacitor and said fourth capacitor in a mutually exclusive manner by enabling said ninth, tenth, fifteenth and sixteenth transistors in alternation with said eleventh, twelfth, thirteenth and fourteenth transistors.

10. The sample/hold circuit of claim 9, further comprising:

a seventeenth transistor having a first channel connection connected to said second terminal of said first capacitor, a second channel connection connected to said second terminal of said third capacitor, and a gate coupled to said switching control circuit, whereby said switching control circuit enables said seventeenth transistor while said second and tenth transistors are enabled, whereby a difference of voltages on said second terminals of said first capacitor and said third capacitor are reduced; and an eighteenth transistor having a first channel connection connected to said second terminal of said second capacitor, a second channel connection connected to said second terminal of said fourth capacitor, and a gate coupled to said switching control circuit, whereby said switching control circuit enables said eighteenth transistor while said sixth and fourteenth transistors are enabled, whereby a difference of voltages on said second terminals of said second capacitor and said fourth capacitor are reduced.

11. A sample/hold circuit comprising:

an amplifier having a first output for providing a first output of said sample/hold circuit, an inverting input and a non-inverting input;

a first capacitor;

a first transistor having a first channel terminal connected to an input voltage of said sample/hold and a second channel terminal connected to a first terminal of said first capacitor;

a second transistor having a first channel terminal connected to a reference voltage of said sample/hold and a second channel terminal connected to a second terminal of said first capacitor;

a third transistor having a first channel terminal connected to said inverting input of said amplifier and a second channel terminal connected to said second terminal of said first capacitor;

a fourth transistor having a first channel terminal connected to said first amplifier output and a second channel terminal connected to said first terminal of said first capacitor;

a second capacitor;

a fifth transistor having a first channel terminal connected to said input voltage of said sample/hold and a second channel terminal connected to a first terminal of said second capacitor;

a sixth transistor having a first channel terminal connected to said reference voltage and a second channel terminal connected to a second terminal of said second capacitor;

a seventh transistor having a first channel terminal connected to said inverting input of said amplifier and a second channel terminal connected to said second terminal of said second capacitor;

an eighth transistor having a first channel terminal connected to said first amplifier output and a second channel terminal connected to said first terminal of said second capacitor;

a switching control circuit coupled to gates of all of said transistors for alternating said first capacitor and said second capacitor in a mutually exclusive manner by enabling said first, second, seventh and eighth transistors in alternation with said third, fourth, fifth and sixth transistors;

a boost capacitor;

a boost transistor having a first channel terminal connected to a gate of said fourth transistor and a second channel terminal coupled to a first terminal of said boost capacitor;

a transmission gate coupled to a second terminal of said boost capacitor and said input of said sample/hold circuit; and a charging circuit for charging said boost capacitor to a predetermined voltage level, and wherein said switching circuit selectively enables said transmission gate and said boost transistor when said fourth transistor is initially enabled whereby a gate voltage of said fourth transistor is boosted in conformity with a value of said amplifier output.

12. A method of sampling an input voltage, comprising:
first alternating a first capacitor between a first sampling position for charging said first capacitor to said input voltage and a first hold position for holding an output voltage of an amplifier; and
second alternating a second capacitor between a second sampling position for charging said second capacitor to said input voltage and a second hold position for holding said output voltage of said amplifier, wherein said second alternating is performed in an opposite phase of said sampling from said first alternating;
boosting a control voltage of a switch performing said first alternating during said first sampling position to a level determined in conformity with said input voltage; wherein said boosting comprises:
charging a boost capacitor to a predetermined voltage;
selectively coupling a first terminal of said boost capacitor said input signal; and
selectively coupling a second terminal of said boost capacitor to a control input of a switch performing said first alternating by alternating said first capacitor to said sampling position.

13. The method of claim 12, wherein said input signal is a differential input signal pair, wherein said amplifier is a fully differential amplifier having a differential amplifier input pair and a differential output pair for providing a differential output of said sample/hold wherein said first alternating alternates said first capacitor between said first sampling position for charging said first capacitor to a first input voltage of said differential input signal pair and alternates a third capacitor between a third sampling position for charging said third capacitor to a second input voltage of said differential input signal pair, and wherein said second alternating alternates said second capacitor between said first sampling position for charging said second capacitor to said first input voltage of said differential input signal pair and alternates a fourth capacitor between a fourth sampling position for charging said fourth capacitor to a second input voltage of said differential input signal pair.

14. The method of claim 13, further comprising:
shorting a first common-mode terminal of said first capacitor to a third common-mode terminal of said third capacitor only while said first capacitor and said third capacitor are selected by said first alternating to said sample position; and
shorting a second common-mode terminal of said second capacitor to a fourth common-mode terminal of said fourth capacitor only while said first capacitor and said third capacitor are selected by said first alternating to said sample position.

15. A method of sampling an input voltage, comprising:
first alternating a first capacitor between a first sampling position for charging said first capacitor to said input voltage and a first hold position for holding an output voltage of an amplifier; and
second alternating a second capacitor between a second sampling position for charging said second capacitor to said input voltage and a second hold position for holding said output voltage of said amplifier, wherein said second alternating is performed in an opposite phase of said sampling from said first alternating;
boosting a control voltage of a switch performing said first alternating during said first sampling position to a level determined in conformity with said input voltage; wherein said boosting comprises;
charging a boost capacitor to a predetermined voltage;
selectively coupling a first terminal of said boost capacitor to said amplifier output signal; and
selectively coupling a second terminal of said boost capacitor to a control input of a switch performing said first alternating by alternating said first capacitor to said hold position.

* * * * *